(12) United States Patent
Kim

(10) Patent No.: US 7,704,851 B2
(45) Date of Patent: Apr. 27, 2010

(54) METHOD OF MANUFACTURING A SEMICONDUCTOR DEVICE

(75) Inventor: Soo Jin Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 298 days.

(21) Appl. No.: 11/616,018

(22) Filed: Dec. 26, 2006

(65) Prior Publication Data

US 2008/0057666 A1    Mar. 6, 2008

(30) Foreign Application Priority Data

Sep. 6, 2006    (KR)    ...................... 10-2006-0085737

(51) Int. Cl.
*H01L 21/76*    (2006.01)
(52) U.S. Cl. .................. 438/422; 438/257; 438/421
(58) Field of Classification Search ................ 438/257, 438/706, 738, 421, 422
See application file for complete search history.

(56) References Cited

U.S. PATENT DOCUMENTS

| 5,869,379 | A | | 2/1999 | Gardner et al. | |
|---|---|---|---|---|---|
| 6,136,686 | A | * | 10/2000 | Gambino et al. | 438/624 |
| 6,190,996 | B1 | * | 2/2001 | Mouli et al. | 438/400 |
| 6,238,987 | B1 | | 5/2001 | Lee | |
| 6,395,631 | B1 | * | 5/2002 | Xu et al. | 438/670 |
| 6,849,546 | B1 | * | 2/2005 | Tu et al. | 438/682 |
| 7,045,849 | B2 | * | 5/2006 | Chen et al. | 257/314 |
| 2004/0058522 | A1 | * | 3/2004 | Lee et al. | 438/618 |
| 2004/0229463 | A1 | * | 11/2004 | Yamada et al. | 438/689 |
| 2005/0221558 | A1 | * | 10/2005 | Lee | 438/257 |

FOREIGN PATENT DOCUMENTS

JP    2000-124454    4/2000

* cited by examiner

*Primary Examiner*—Bradley K Smith
(74) *Attorney, Agent, or Firm*—Townsend and Townsend and Crew LLP

(57) ABSTRACT

A method of manufacturing a semiconductor device includes providing a semiconductor substrate with gate structures. A sacrificial insulating layer is formed between the gate structures at a height lower than that of the gate structures such that a portion of each gate structure is exposed above the sacrificial insulating layer. Spacers are formed on sidewalls of the exposed portions of the gate structures. A portion of the sacrificial insulating layer between the spacers is exposed. The sacrificial insulating layer is removed, thereby forming spaces below the spacers. An insulating layer is formed to fill the spaces between the spacers such that air pockets are formed between the gate structures and below the spacers.

11 Claims, 3 Drawing Sheets

METHOD OF MANUFACTURING A SEMICONDUCTOR DEVICE

CROSS-REFERENCES TO RELATED APPLICATIONS

The present application claims priority to Korean patent application number 10-2006-085737, filed on Sep. 06, 2006, which is incorporated herein by reference in its entirety.

BACKGROUND OF THE INVENTION

The present invention relates to semiconductor devices, and more particularly to a method of manufacturing a semiconductor device, which can reduce interference capacitance between gates.

In a NAND flash memory fabrication method, space in which unit active regions and unit field regions are formed is reduced as the level of integration of devices is increased. As a dielectric layer (including a floating gate, a control gate and so on) is formed in a narrow active space, the distance between the gates is reduced. Accordingly, interference capacitance becomes problematic.

An equation to calculate an interference capacitance value between conductors is $C = \in \times A/d$ (where $\in$ denotes the dielectric constant, A denotes the area, and d denotes the distance). From the equation, it can be seen that the smaller the distance, the larger the area, and the higher the dielectric constant, the higher the interference capacitance value C.

Furthermore, if the distance between the gates is reduced, the interference capacitance between the gates increases, so that the read speed of a device decreases.

BRIEF SUMMARY OF THE INVENTION

Embodiments of the present invention are directed to a method of manufacturing a semiconductor device, in which space between gates is formed with an air layer having a low dielectric constant, thereby reducing interference capacitance between neighboring gates.

In one embodiment, a method of manufacturing a semiconductor device includes providing a plurality of gate structures over a semiconductor substrate. A sacrificial insulating layer is formed between the gate structures. The sacrificial insulating layer is etched to have a height lower than that of the gate structures such that a portion of each gate structure is exposed above the sacrificial insulating layer. Spacers are formed on the exposed portion of each gate structure. A portion of the sacrificial insulating layer between the spacers is exposed. The sacrificial insulating layer is removed to form spaces below the spacers. An insulating layer is formed in the spaces between the spacers to form air pockets between the gate structures and below the spacers.

In another embodiment, a method of manufacturing a semiconductor device includes providing a semiconductor substrate with a plurality of columns each of which includes conductive lines. A sacrificial insulating structure is formed over the semiconductor substrate. The sacrificial insulating structure has a height that is lower than the columns of conductive lines. Spacers are formed on the exposed sidewalls of the columns of conductive lines over the sacrificial insulating structure. The sacrificial insulating structure is removed. An insulating layer is formed to fill the spaces between the spacers. The insulating layer defines air pockets between the columns.

In another embodiment, a method of manufacturing a semiconductor device includes providing a semiconductor substrate having first and second gate structures. An insulating layer is formed over and between the first and second gate structures. The insulating layer defines at least one air pocket between the first and second gate structures.

DESCRIPTION OF SPECIFIC EMBODIMENTS

Specific embodiments according to the present invention will be described with reference to the accompanying drawings.

FIGS. 1A to 1G are cross-sectional views for illustrating a method of manufacturing a semiconductor device according to an embodiment of the present invention.

Figure 1A:
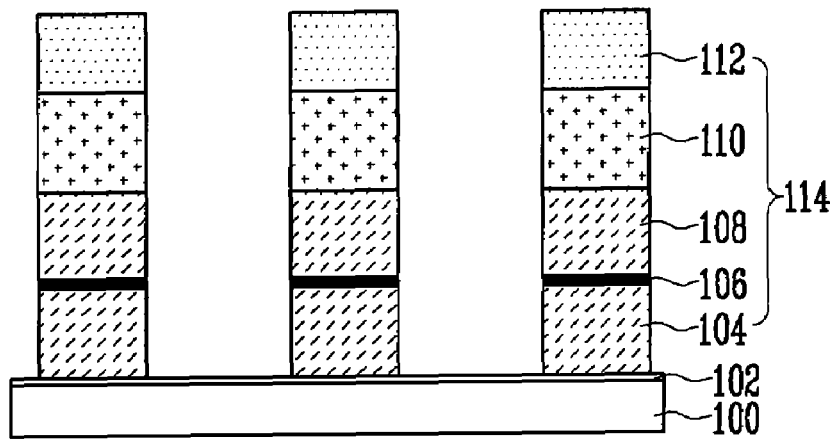
FIGS. 1A to 1G are cross-sectional views for illustrating a method of manufacturing a semiconductor device according to an embodiment of the present invention.

Referring to FIG. 1A, conductive lines, such as a plurality of gate structures 114, are formed over a semiconductor substrate 100 at predetermined intervals. A tunnel oxide layer 102 is formed over the substrate 100. A first polysilicon layer 104 for a floating gate, a dielectric layer 106, a second polysilicon layer 108 for a control gate, a tungsten silicide layer 110 and a hard mask layer 112 are formed over the tunnel oxide layer 102 and then etched to form the gate structure 114.

Figure 1B:
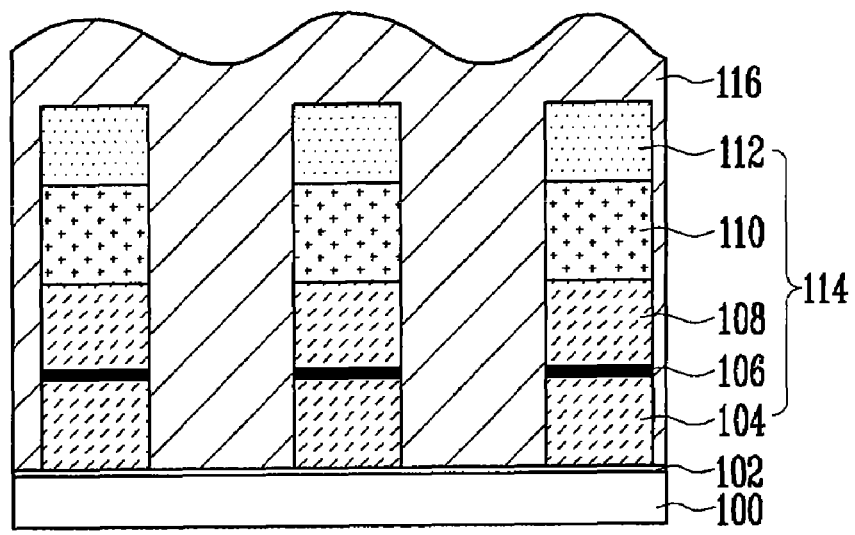

Referring to FIG. 1B, an ion implantation process using the gate structures 114 as a mask is performed to form a source and drain junction (not shown) within the semiconductor substrate 100. A sacrificial insulating layer 116 is formed on the surface of the semiconductor substrate 100 and sidewalls of the gate structures 114 such that space between the gate structures 114 is gap-filled. The sacrificial insulating layer 116 is preferably formed using a material capable of being removed using $O_2$ plasma. For instance, the sacrificial insulating layer 116 may be formed using amorphous-carbon (a-C), Spin-On-Coating (SOC) or an i-line photoresist film.

Figure 1C:
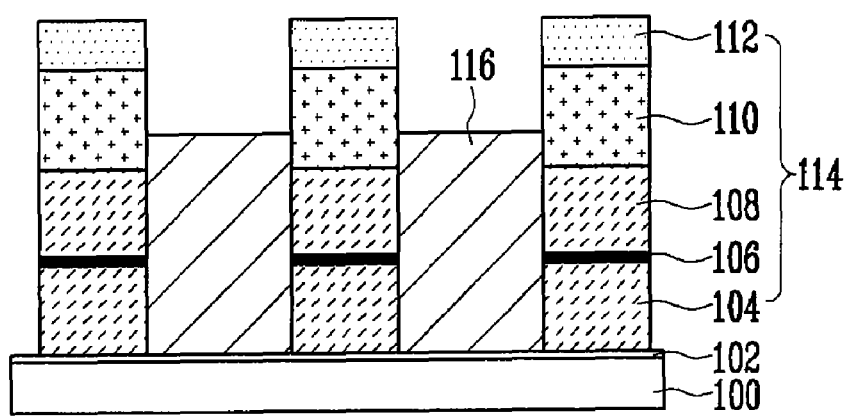

Referring to FIG. 1C, the sacrificial insulating layer 116 is etched such that it remains between the gate structures 114 at a height lower than that of the gate structures 114. The sacrificial insulating layer 116 may be etched by means of an etch-back process. It is preferred that the sacrificial insulating layer 116 be etched such that at least a portion of the sidewalls of the tungsten silicide layer 110 is exposed in each gate structure 114. Thus, the hard mask 112, and at least a portion of the sidewalls of the tungsten silicide layer 110 are exposed in each gate structure 114. The first polysilicon layer 104, the dielectric layer 106, and the second polysilicon layer 108 remain covered by the sacrificial insulating layer 116 that has been etched in the present embodiment.

Figure 1D:
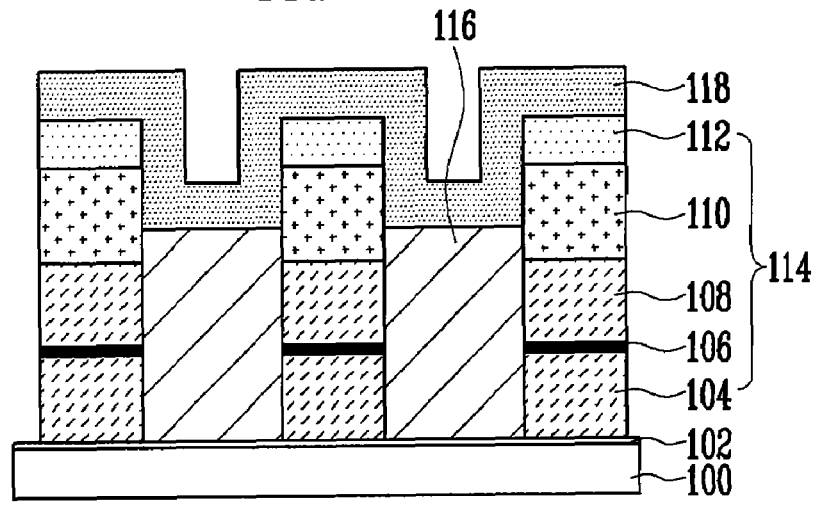

Referring to FIG. 1D, a first insulating layer 118 for spacers is formed on the surface of the insulating layer 116 and the sidewalls of the exposed portions of each gate structure 114 (e.g., the exposed portions of the tungsten silicide layers 110 and the hard masks 112). The first insulating layer 118 is preferably formed using a material with a different etch selectivity than that of the sacrificial insulating layer 116. The first insulating layer 118 may be formed using an oxide layer or a nitride layer in a temperature range of 200 to 400 degrees Celsius by means of an Enhanced Chemical Vapor Deposition (PE-CVD) method.

Figure 1E:
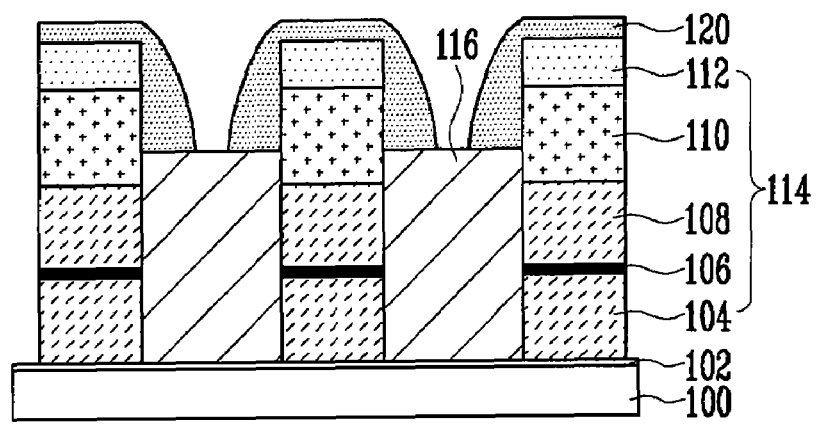

Referring to FIG. 1E, the first insulating layer 118 is etched by means of a dry etch process to form spacers 120 on the exposed sidewalls of each gate structure 114 that project above the sacrificial insulating layer 116.

In order to prevent the tungsten silicide layer 110 from being exposed when the hard mask 112 is etched in a process of removing the sacrificial insulating layer 116 by a subsequent process, the first insulating layer 118 may be etched to remain on the hard mask 112 at a given thickness at the time of the etch process for forming the spacers 120. As the spacers 120 are formed, a portion of the sacrificial insulating layer 116 is exposed between the spacers 120.

Figure 1F:
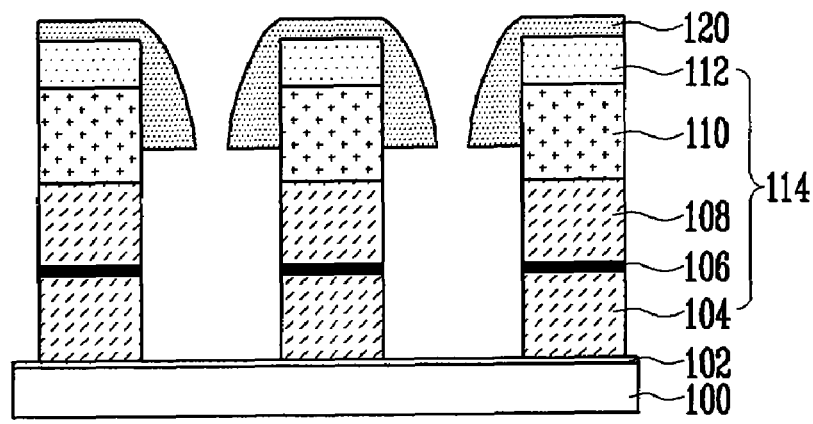

Referring to FIG. 1F, the sacrificial insulating layer 116 below the spacers 120 and between the gate structures 114 is removed. Thus, spaces are formed below the spacers 120 between the gate structures 114. The sacrificial insulating layer 116 may be removed using $O_2$ plasma. During removal of the sacrificial insulating layer 116, the spacers 120 are not removed due to a difference in the etch selectivity.

Figure 1G:
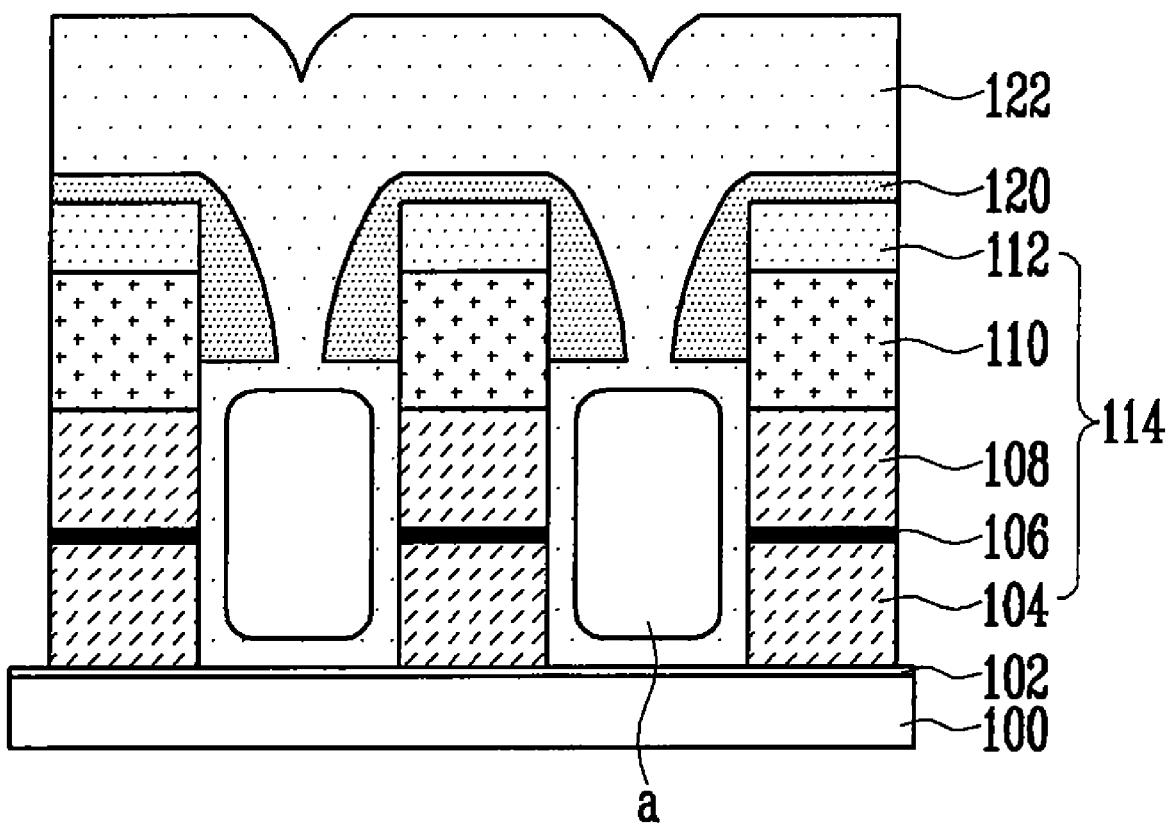

Referring to FIG. 1G, a second insulating layer 122 is formed on the exposed surfaces of the spacers 120, the gate structures 114 (not including the hard mask 112 and the unexposed portion of the tungsten silicide layer 110), and the tunnel oxide layer 102. The second insulating layer 122 is formed using an oxide layer in the furnace of a high temperature (e.g. at a temperature range of between 500 and 900 degrees Celsius). The spaces between the spacers 120 are nit clogged (i.e., filled) as the second insulating layer 122 is formed. Consequently, the second insulating layer 122 forms an enclosed space (or air pocket) "a" between the gate structures 114 and below the spacers 120.

As described above, according to the present invention, the spaces below the spacers and between the gates include the air pockets "a" having a low dielectric constant, i.e., the dielectric constant of the air. Accordingly, interference capacitance between neighboring gates is reduced.

Furthermore, since interference capacitance between the gates is reduced, the read speed of a device increases.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A method of manufacturing a semiconductor device, the method comprising:
   providing a plurality of gate structures over a semiconductor substrate, wherein each gate structure comprises a floating gate, a dielectric layer, a control gate and a silicide layer;
   forming a sacrificial insulating layer between the gate structures;
   etching a portion of the sacrificial insulating layer to expose sidewalls of the suicide layers;
   forming spacers on the sidewalls of the silicide layer, wherein the sacrificial insulating layer is exposed between the spacers;
   removing the sacrificial insulating layer to form spaces between adjacent gate structures and below the spacers; and
   filling the spaces with an insulating layer to form air pockets in the insulating layer under the spacers and between sidewalls of the floating gates, the dielectric layers and the control gates of adjacent gate structures.

2. The method of claim 1, wherein the sacrificial insulating layer is formed of a material capable of being removed by $O_2$ plasma.

3. The method of claim 1, wherein the sacrificial insulating layer is formed such that at least a portion of the sidewalls of each gate structure is exposed above the sacrificial insulating layer.

4. The method of claim 1, wherein the sacrificial insulating layer is formed of one of: amorphous-carbon, Spin-On-Coating (SOC) or an i-line photoresist film.

5. The method of claim 1, wherein the insulating layer defines a single air pocket between two adjacent gate structures.

6. The method of claim 1, wherein the spacers have an etch selectivity different than that of the sacrificial insulating layer.

7. The method of claim 1, wherein the spacers are formed using an oxide layer or a nitride layer in a temperature range of 200 to 400 degrees Celsius by means of an Enhanced Chemical Vapor Deposition (PE-CVD) method.

8. The method of claim 1, wherein the spacers are formed using a dry etch process.

9. The method of claim 1, wherein during spacer formation, a portion of the sacrificial insulating layer remains on the sidewalls of the gate structures.

10. The method of claim 1, wherein the sacrificial insulating layer is removed using $O_2$ plasma.

11. The method of claim 1, wherein the insulating layer is an oxide layer.

* * * * *